United States Patent [19]

Jennings et al.

[11] Patent Number: 4,819,150
[45] Date of Patent: Apr. 4, 1989

[54] ARRAY FOR SIMULATING COMPUTER FUNCTIONS FOR LARGE COMPUTER SYSTEMS

[75] Inventors: Andrew T. Jennings, West Chester; Joseph S. Schibinger, Phoenixville; Ronald J. Kalemba, Berwyn, all of Pa.

[73] Assignee: Unisys Corporation, Blue Bell, Pa.

[21] Appl. No.: 720,573

[22] Filed: Apr. 5, 1985

[51] Int. Cl.⁴ .................................................. G06F 1/00
[52] U.S. Cl. .................................................... 364/200
[58] Field of Search ... 364/200 MS File, 900 MS File, 364/578

[56] References Cited

U.S. PATENT DOCUMENTS

| | | | |
|---|---|---|---|
| 4,306,286 | 12/1981 | Cocke et al. | 364/200 |
| 4,584,642 | 4/1986 | Fudanuki | 364/200 |
| 4,587,625 | 5/1986 | Marino, Jr. et al. | 364/900 X |

Primary Examiner—Raulfe B. Zache
Attorney, Agent, or Firm—Mervyn L. Young; Kevin R. Peterson

[57] ABSTRACT

An array of various types of processors for the purpose of simulating computer functions for large computer systems. These functions may vary from simple AND, OR and other functions to large arithmetic logic units and even random access memories. The simulation array is a tree-type array where the leaves of the tree are the actual logic simulation processors with the other processors serving as nodes which route change of value notices among the various logic simulation processors.

11 Claims, 5 Drawing Sheets

ARRAY FOR SIMULATING COMPUTER FUNCTIONS FOR LARGE COMPUTER SYSTEMS

RELATED U.S. PATENT APPLICATION

U.S. patent applications directly or indirectly related to the subject application are the following:

Ser. No. 720,574, filed Apr. 5, 1985, now abandoned, by Frederick G. Fellenser et al., entitled Logic Simulation Processor in an Array for Simulating Computer Functions for Large Computer Systems and its continuation Ser. No. 038,463 filed Apr. 13, 1987 now abandoned.

BACKGROUND OF THE INVENTION

FIELD OF THE INVENTION

This invention relates to an array of processing elements and more particularly to such an array that is adapted to concurrently simulate various functions that occur in a processor and other elements of a computer system, which functions may vary from that of a subsystem down to the function of individual gates.

Before the design of a computer system is implemented in prototype form, it is customary to simulate the functions of the various elements in order to facilitate easier design error diagnostics, reduce engineering rework cycles and also to facilitate easier field engineering change capabilities. Design verification by such simulations reduces cost arising from design error.

For the most part, past design simulations have been carried out on general purpose computers under software control. However, software simulation can often require up to thousands of hours of computer time, particularly for larger computer systems with an increased time lapse from the beginning of the system definition through circuit design until the completion of the system hardware prototype.

For this reason, special purpose systems have been built to specifically simulate system logic design at a hardware level with great reductions in simulation times by a factor of tens of thousandths. Particular hardware simulators are described for example in DeNeau, THE YORKTOWN SIMULATION ENGINE, IEEE Reports of the Nineteenth Design Automation Conference and in Abramovici et al., A LOGIC SIMULATION MACHINE, reported in the same Conference Reports.

For the most part, special purpose computers for design simulation have been of stand-alone variety in either a parallel nature or pipeline nature or a combination of both with very complex control structures being required. The majority of special purpose simulation computers have been designed and built at research laboratories for the purpose of studying design simulation. However, it is desirable to use a special purpose simulation machine that can be employed in a design center associated with a manufacturing plant so that engineering changes and commercial system upgrading can be more easily accommodated.

It is then an object of the present invention to provide an improved special purpose simulation computer system.

It is another object of the present invention to provide such a special purpose system having reduced control complexity.

It is still a further object of the present invention to provide such a system which acts as an auxiliary system that is driven by a host general purpose computer.

SUMMARY OF THE INVENTION

In order to accomplish the above-identified objects, the present invention resides in a large number of logic processors which simulate the logic equations, state elements and storage devices which processors are separably programmable and arranged in a treelike structure. A plurality of network processors form intermediate nodes of the tree network and perform signal routing functions. A control processor coordinates the simulation process, the application of external stimuli and the control of signal monitoring and fault injection mechanisms. The control processor also provides the external interface to a host system which may be a general purpose computer.

A feature of the present invention then resides in a treelike array of processing elements each of which simulates logic equations, state elements and storage arrays under a hierarchical control.

BRIEF DESCRIPTION OF THE DRAWINGS

The above-identified objects, advantages and features of the present invention will become more readily available from a review of the following specification when taken in conjunction with the drawings wherein.

GENERAL DESCRIPTION OF THE INVENTION

Figure 1:
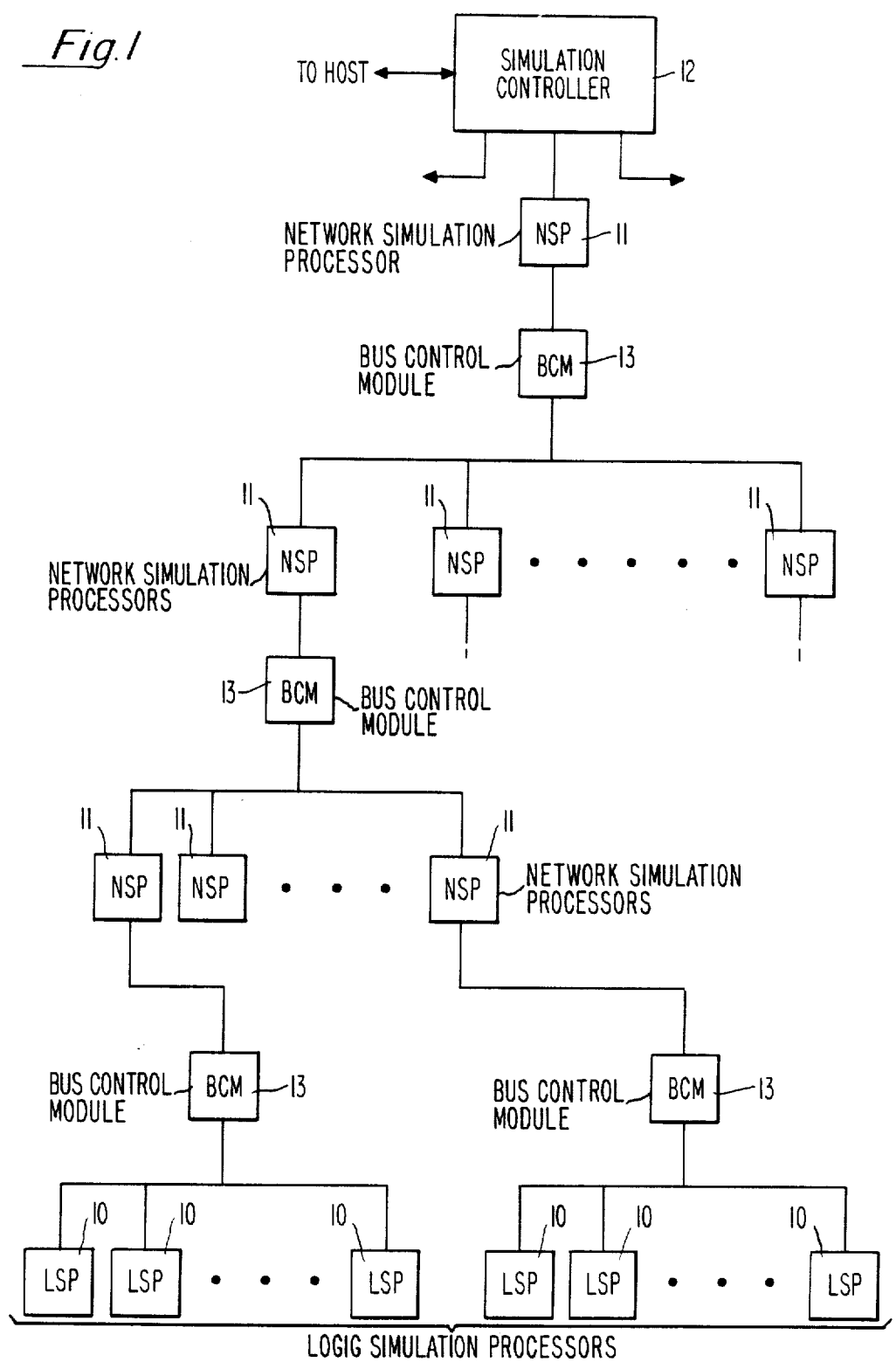
FIG. 1 is a schematic diagram of an array employing the present invention.

An array of special purpose processors to provide logical simulation capabilities is illustrated in FIG. 1. This array is capable of performing functional, implementation level simulation of very large and complex system designs at speeds which are many magnitudes larger than those that are possible with software simulators. As illustrated in FIG. 1, the array is essentially a treelike array.

Logic simulation processors 10 which form the leaves of the tree simulate the logic equations, state elements and also can simulate memory structures. Network simulation processors 11 form the intermediate branches or nodes of the tree and perform signal routing functions as well as other functions which will be more fully described below. Various buses provide interconnections between the array simulation processors. Access by the respective processors to their immediate bus is under control of bus control modules 13. Each of the respective processors contains its own program and data and communicates with other processors by passing change notices up and down the tree.

Simulation control processor 12 coordinates the simulation process, the application of external stimuli and the control of signal monitoring and fault injection mechanisms that are more thoroughly described below.

Simulation control processor 12 also provides the external interface from the array to a host system which may be a commercially available processing system. In the embodiment of the present invention, each array can consist of up to approximately three hundred (300) separately programmable processing elements and each simulation control processor can control up to three simulation arrays.

With treelike arrays of the present invention, each array can be partitioned among various parts of the tree to simulate functions at a gate level as will be more thoroughly described below. The size of each partition will depend upon the complexity of the logic functions being simulated. Furthermore, each processor in the partitioned array can report a signal change as it occurs so that the output of the simulation will illustrate to the computer designer the various states that the different elements go through as the logic function is being executed during any given clock time.

Figure 2:
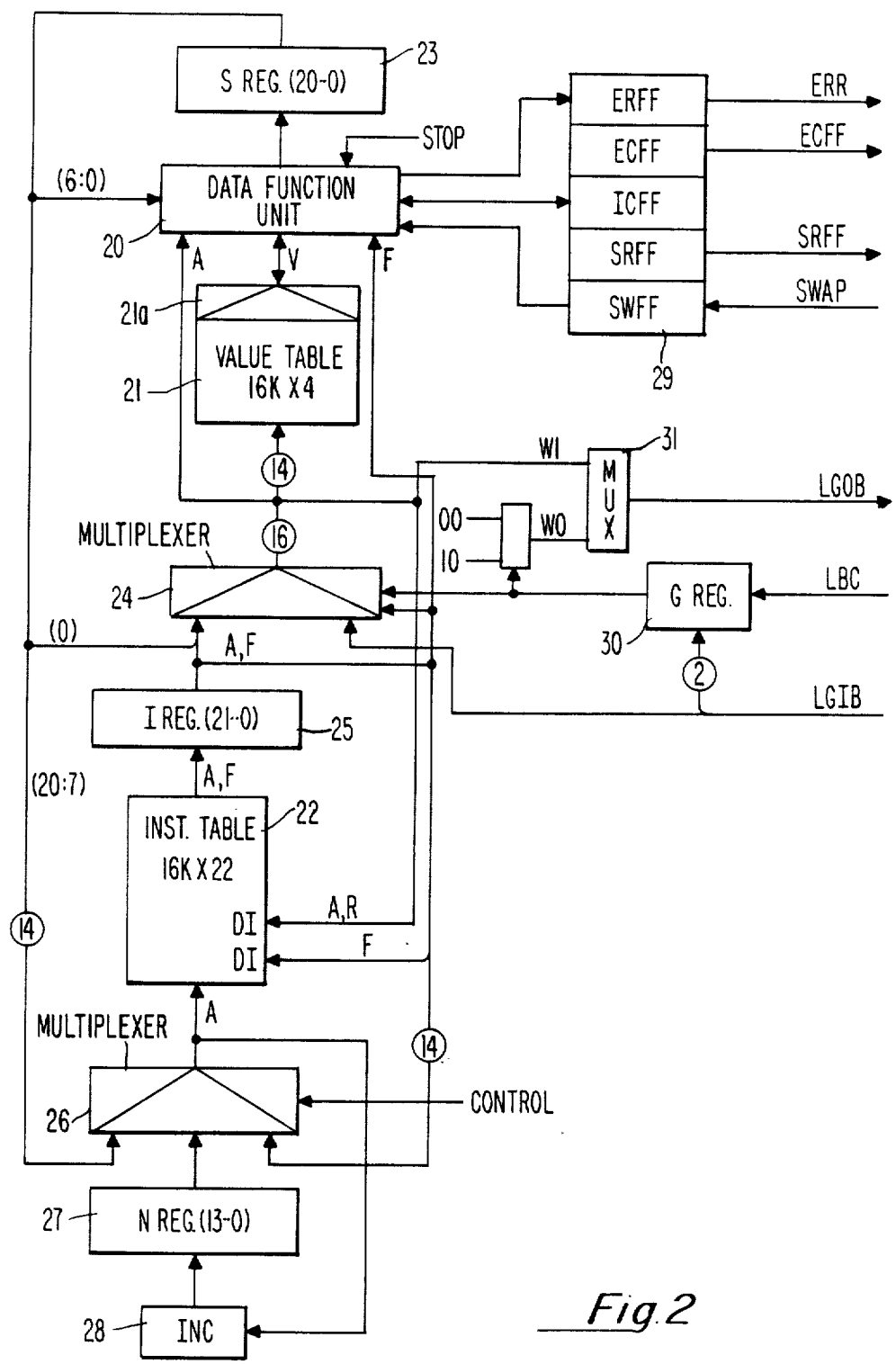
FIG. 2 is a schematic diagram of one of the logic simulation processors employed in an array of such processors.

All of the logic simulation processors 10, of FIG. 1 are identical and are as illustrated in FIG. 2. As shown therein, the logic simulation processor's principal elements are data function unit 20, value table 21 and instruction table 22. Data function unit 20 is a one bit wide stack processor and has a 21 element last in-first out stack, or pushdown stack, the top location of which is represented in FIG. 2 by S register 23. Stack 23 is manipulated by various instructions in the instruction set to be described below. Apart from the logical operators, the instruction set includes functions to check for changes in signal values and to detect edges or changes in the clock signal being simulated by the simulation of the logic function.

Values that are stored in value table 21 may be thought of as representing a schematic or diagram of the current function being simulated, which function is implemented by the sequence of instructions stored in instruction table 22.

Value table 21 is, in essence, three tables each of which is one bit wide and 16 K deep. These tables are addressed by addresses that are referred to as signal names and contained in the respective instructions that were loaded into instruction table 22. These three value tables are not actually shown in FIG. 2 for reasons of simplicity as will be understood by one skilled in the art. The present value table (Vp) contains the current value of all signals that are to be propagated during the current simulation cycle. The next value table (Vn) contains the initial value of all signals at the start of the next simulation cycle. When no delay is called for by the current function being executed, Vn and Vp are identical at all times. Unit delays are handled by writing a new signal value to Vh only, thus delaying its propagation until the start of the next simulation cycle. The third value table (Vf) is used to induce a fault into the function logic.

In addition to containing a sequence of instructions to control data function unit 20, instruction table 22 may also be used to contain the internal state of a random access memory when such a random access memory is being simulated. When a logic function is being simulated, the simulator instructions are of the following general form:

(Address)(n_c ) (f) (op_code)

where the address is an address to an instruction in instruction table 22 or a value table address depending upon the current op_code being executed; n_c represents either the normal or complement value of the input signal being implemented or the normal or complement value of the current top of the stack; f indicates a variation function of the op_code and op_code represents the operation to be performed by data function unit 20. As will be further described below, data function unit 20 contains a circuit for nearly each op_code or else the op_code can be implemented by a combination of such circuits. The output of data function 20 is usually stored in top of stack register 23 and the inputs to data function unit 20 are from value table 21 and register 23.

Instruction Set

The instruction set employed by the logic simulation processor of FIG. 2 is divided into four types. The largest group of instruction is the push-type instructions which use value table 21 and top-of-stack register 23 as sources for inputs to data function unit 20 and always push a result value onto the top-of-stack register 23. For some of this type of op_code functions, just the top-of-stack register 23 is employed as the source for the instruction inputs. As was indicated above, the address field of the instruction is to a location in value table 21 and is referred to as the signal name. This group of instructions include all of the logical functions such as AND, OR, XOR(EXCLUSIVE OR) and various combinations thereof. In addition, this group of instructions includes the PUSH instruction which loads the signal value onto top-of-stack register 23; select operator SEL which performs a two-input multiplex function, where one of two values is selected from top-of-stack register 23. If the first one is true, the second value is selected, otherwise a third value is selected. The result is left on the top of the stack. Also included in this group is the majority operator MAJ which performs a three-input majority function with the result being left on the top of the stack register 23.

The next group of instructions is the store-type instructions. These instructions use top-of-stack register 23 as their input and store the result in either the present or next value location of value table 21 which location is specified by the instruction address field, the signal name. The op_code function is ignored by this instruction type. The delay operator DLY performs the unit delay function where the top-of-stack item, inverted, if so requested, is compared to the present state value of the signal name. If they are not equal, swap required flip-flop (SRFF) of the bank of flip-flops 29 is set and the next state value of the signal name is replaced by the top-of-stack value which is then deleted from the stack. When a swap is required, it is initiated by the controlling network simulation processor setting SWAP flip-flop SWFF in the bank of flip-flops 29 of FIG. 2. This causes multiplexer 21 of FIG. 2 to select a value from the next value table Vn rather than the present value table Vp.

Two important operators in this group are the internal check-for-change in the present value of the signal name (CHKI) and the external check-for-change in the value of the signal name (CHKE). The internal change check is for checking the present value of the signal name. The top-of-stack item, inverted if so requested, is compared to the present state value of the signal name. If they are not equal, internal change flip-flop (ICFF) in the bank of flip-flops 29 is set and the present state value of the signal name is replaced by the top-of-stack value which is then deleted from the stack. The external check-for-change in the signal name is similar except that, if the change has occurred, the signal name and its new value are forwarded to the respective controlling network simulation processor. The external check operator must be used for signals which are external to the logic simulation processor of FIG. 2.

The third group of instructions that may be employed are for the purpose of random access memory simulation and include two operators one of which is used to read/write the instruction table when it is being used in its simulated random access memory state. The second operator reserves instruction locations to hold data for the simulated random access memory.

The last group of instructions is the control type instructions which may use the top-of-stack as their input, but their result is to change the flow of control of the logic simulation processor. The op_code function is a branch function and the instruction address field is an instruction location (an instruction name).

The two operators in this last group are the branch operator (BRCH) and end-of-loop operator (ENDL). If the branch function is true, then the address of the next instruction to be executed is the instruction name associated with this operator. Otherwise, the execution continues with the next instruction immediately following the branch operator. The end-of-loop operator (ENDL) is used to signify the end of one iteration of the current code in the instruction table 22 of FIG. 2. The operator transfers the current contents of the internal change flip-flop to the external change flip-flop and resets the former.

Simulation Operation

The function simulation of the present invention is performed by sequencing through the set of instructions that were stored in instruction table 22 by incrementing the contents of N register 27. This sequencing is repeated until no changes in the respective signal values stored in value table 21 are detected. This represents that the current function being simulated has reached a steady or stable state. The logic simulation processor of FIG. 2 then waits until some external signal change is received which causes either one of the inputs to change by changing a value stored in value table 21 or if swap flip-flop SWFF of FIG. 2 is set causing multiplexer 21a to select next state value table Vn rather than the present state value table Vp. Then function simulation is repeated. When a branch instruction is encountered, its address is used to address instruction table 22 by way of multiplexer 26. Instruction table 22 can also be addressed from S register 23 as indicated in FIG. 2.

The tracking of changes and reporting thereof to simulation controller 12 of FIG. 1 is controlled by three flip-flops of the bank of flip-flops 29 of FIG. 2, namely the internal change flip-flop ICFF, the external change flip-flop ECFF, and the swap required flip-flop SRFF. The internal change flip-flop and the external change flip-flop are set whenever a change to the present value of an internal signal is detected. At the end of each iteration of the sequence of instructions, the current value of the internal change flip-flop is loaded into the external change flip-flop and the former is reset. The external change flip-flop is also set whenever a command to swap the present next state value tables is received and the swap required flip-flop (SRFF) is set. This SRFF flip-flop is set whenever a unit delay function detects that the next state value is not equal to the present state value. It is reset at the start of each iteration of the code. These latter functions are implemented by the delay operator DLY, the check for internal change operator CHKI and the end-of-loop operator ENDL which were described above.

When it is required to simulate clock state elements, a change of value notice can be sent to the logic simulation processor of FIG. 2 to change the value of an appropriate present state value associated with a given instruction. When this changed value is encountered by the comparison process described above, the external change flip-flop is set thus notifying the simulation controller that the clock signal value has changed.

DETAILED DESCRIPTION OF THE INVENTION

As was indicated in FIG. 1, each logic simulation processor 10 communicates with its controlling network simulation processor or node 11 by way of a corresponding bus control module 13. In FIG. 2, messages are sent from the logic simulation processor shown therein on local global output bus (LGOB) and are received from its corresponding bus control module on local global input bus (LGIB). Transmission over the buses is controlled by local bus control bus (LBC) which also includes the outputs from the control flip-flops 29 and swap signal to swap flip-flop (SWFF).

Figure 3:
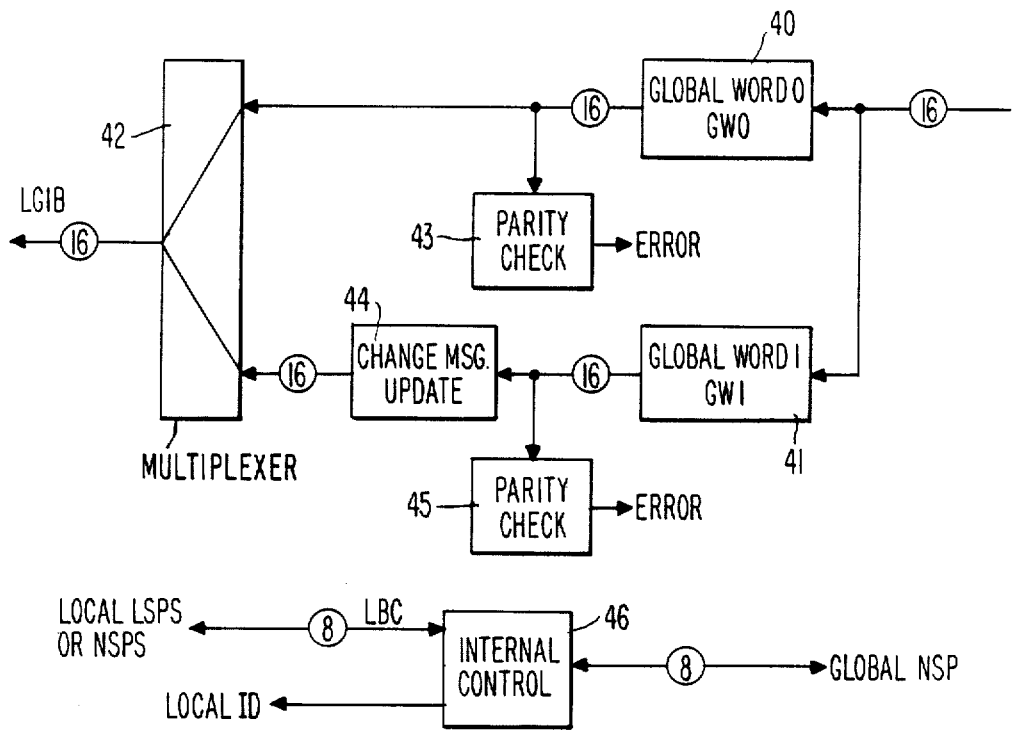
FIG. 3 is a schematic diagram of the bus control module as employed in the present invention.
Figure 3:
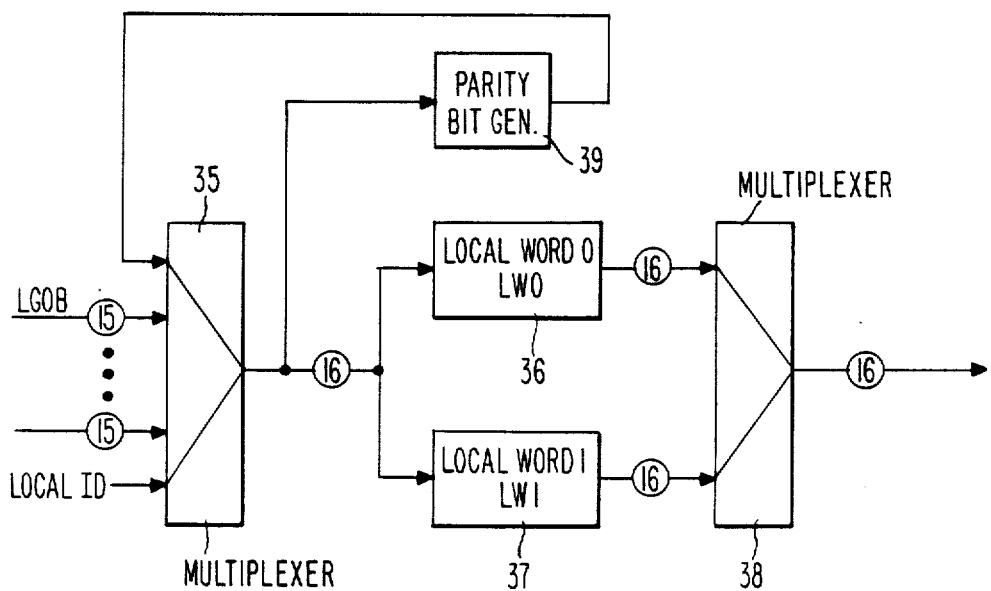

A diagram of the respective bus control modules 13 of FIG. 1 is illustrated in FIG. 3. The basic protocol used on all the interfaces is that any node may always transmit to any of its local nodes and that a local node must explicitly request permission to transmit to its next global node.

The general form of the messages transmitted is
(Flag) (init) (Signal Name) (Value) The Flag and init bits form an "op_code" for the controlling network simulation processor. If the transmission is down the tree toward a logic simulation processor, these bits have one of three interpretations as follows: Simulation Change Notification, Read Request from Logic Simulation Processor, and Write Request from Logic Simulation Processor. If the transmission is up the tree towards simulation controller 12 of FIG. 1, these bits again have one of three interpretations as follows: Simulation Change Notification, Read Response from the Logic Simulation Processor, and also a separate flag bit is used to indicate an Off-Line/Error condition.

If the transmission is up the tree, the message is preceded by its source designation and if the transmission is down the tree, the message is preceded by its destination designation.

In FIG. 3, when a particular logic simulation processor has been given permission to transmit by the bus control module of FIG. 3, its particular local global output bus (LGOB) is selected by multiplexer 35 which receives two words in succession that are sent respectively to local word 0 register 36 and local word 1 register 37. As was indicated above, local word 0 is a source designation while local word 1 is the message being transmitted. These two words are then sent in succession to the controlling network simulation processor by way of multiplexer 38. While the respective local global output buses at input to multiplexer 35 are shown as being 15 bits wide, they are actually 16 bits wide with one bit not being used as it is reserved for a parity bit which is generated by parity generator 39.

When the message is travelling down the tree, the destination designation is received by global word 0 register 40 and the message by global word 1 register 41 which words are then sent in succession on the selected local simulation processor's local global input bus (LGIB) by way of multiplexer 42. Parity check circuits 43 and 45 check parity and notify the controlling network simulation processor if an error occurs.

Internal control unit 46 controls the respective input and output buses from the selected logic simulation processor as well as their control signals from flip-flops 29 of FIG. 2. Internal control unit 46 contains two flip-flops for each of the devices to which they are attached. These are the error and off-line flip-flops. The device which has an off-line flip-flop set will be ignored by the bus controller. If a message is received by the bus controller which is directed to a device which has its off-line flip-flop set, it will respond to the sender by transmitting an error flag. If the device detects an internal error or an error on a transmission from a bus controller or the bus controller detects an error on the transmission from one of its devices, it sets both the off-line flip-flop and the error flip-flop for that device and generates an error flag. This mechanism is also contained within the controlling network simulation processor. In this case, the off-line flip-flop and error flip-flop are used to track errors internal to its network simulation processor and error flag reports as a result of parity errors detected by the bus controller or errors reported by a local device. However, unlike the bus controllers, the network simulation processor does not generate an error flag.

Figure 4:
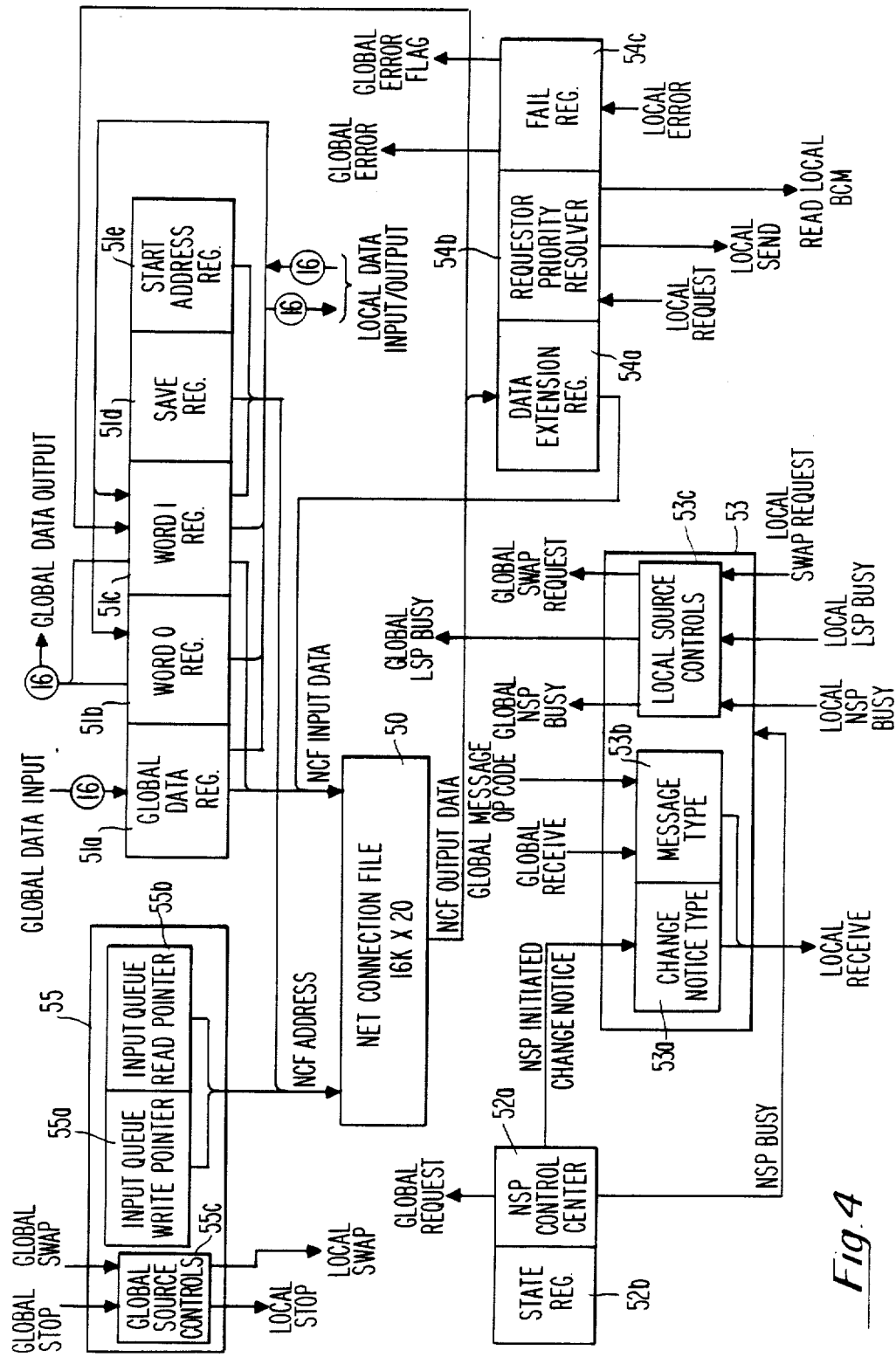
FIG. 4 is a schematic diagram of the controls of a node or network simulation processor employed in the simulation array.

Network simulation processors 11 of FIG. 1, which form the various nodes of the array tree all have the same structure which is illustrated in more detail in FIG. 4. This processor is a small table-drive processor whose main function is to route change notices between the various local simulation processors 10 of FIG. 1. Each network simulation processor controls either lower level network simulation processors or logic simulation processors and each logic simulation processor and network simulation processor is controlled by one, and only one, network simulation processor. As indicated in FIG. 1, the root of the tree thus formed is connected to simulation controller 12.

The processor of FIG. 4 maintains net connection file 50 which consists of a linked list of all sources and loads for the signals it is responsible for routing. Network connection file 50 is partitioned into a number of fixed areas. The first area or section contains tables for each of the devices being immediately controlled. The second section is used as a queuing area in which inputs from a higher level controller are buffered pending action by the network simulation processor of FIG. 4. A third section contains a single table for signals which are global to the processor of FIG. 4, namely signals which are to be routed to the device controlling this processor. The partitioning of network connection file 50 differs slightly from network simulation processor to network simulation processor depending upon which type of device is being controlled. In this description, "local signals" are signals whose value is received from and/or sent to the devices being controlled, and "global" signals are those whose value is received from and/or sent to the device which is controlling. Network connection file 50 in each network simulation processor may contain any number of local signals but no more than one global signal.

The network simulation processor of FIG. 4 is event-driven. It accepts a change to a signal source value, calculates the new resultant value for the loads on that partition of the network which it controls and then forwards this value to the affected devices if necessary. As indicated in FIG. 1, each network simulation processor receives and sends local messages to and from a lower level bus control module 13 and also sends and receives global messages to a higher level bus control module 13. These messages may be either change notices, as described above, or may be commands required to load the value and instruction tables of the local simulation processors 10 which form the leaves of the tree in FIG. 1.

In FIG. 4, data is received from both the lower level controlled devices and the upper level controlling device by way of input/output registers $51a$ ..., $e$. Input data from the global or controlling device is received by global data register $51a$. Input data from a controlled device is received by word 0 register $51b$ and word 1 register $51c$, which registers are also used to transmit output data to a controlled device as will be more thoroughly described below. Save register $51d$ is used to remember a bidirectional location during the accessing of network connection file 50 and start address register $51e$ provides an address for starting the network connection file operation, as will be more thoroughly described below. Word 0 register $51b$ and word 1 register $51c$ are also employed to transmit output data to the global or controlling bus control module.

As indicated above, the processor of FIG. 4 accepts the change to a signal source value, calculates the new resultant value for the loads on the particular partitioned portion of the network controlled by the network simulation processor of FIG. 4 and then forwards this value to the affected controlled devices whether they are logic simulation processors or network simulation processors. The new load value is calculated by an algorithm under the control of NSP control center $52a$. State register $52b$ keeps track of what state the NSP control center is in.

The calculation algorithm will now be described. If there is no global, bidirectional node in a particular partitioned network, the load value is calculated by summing (OR-ing or AND-ing) all of the local source values (assuming wire-ORed logic) and this value, if different from the present value, is then distributed to all the loads (each of the controlled device tables in network connection file 50) for subsequent transmission to the affected devices. If a global, bidirectional node does exist in the partitioned network and the change is to a local source, the local sources are summed as described above, and the global load is set to this value without changing the value of the local loads. If a global, bidirectional node exists in the particular partition network and the change is to global source, the global source value is distributed to all the local loads. A node is bidirectional if both the load valid and source valid signals are set, as will be described below.

The calculation is performed by using the name of the signal for which the change notice has been received (the 14 least significant bits of word 1), qualified by the name of the device from which it was received, as the starting point in network connection file 50, and traversing the linked entries until the original signal name is encountered again. To both calculate the new load value, and distribute it, may require more than one traversal of the list (but not more than two traversals). The number of traversals required may be minimized by specifically marking the source node on a single source net as such, remembering the starting address from register 51, and remembering the bidirectional location address if one is encountered in register 51d. There will not be complete traversals because of the start address register 51e and save register 51d d and the fact that the entries in net connection file 50 are linked in an ordered fashion.

For example, in a global-to-local operation, sixteen bits of global input data are transferred from global data register 51a to the input queue (not shown) in network connection file 50. When NSP control center 52a is not managing other functions, it causes the output of the input queue to be transferred to word 1 register 51c as the starting address in network connection file 50. It is used to retrieve a twenty-bit data word which is put into word 1 register 51c and data extension register 54a. The value passed in during the transfer from input queue to word 1 register 51c (bit 14) is saved in an internal flip-flop. Bit 15 is parity. The 14 least significant bits of word 1 register 51c are now a linking address into network connection file 50; the next two bits (14 and 15) are the source valid code; bit 16 is the load valid bit; bit 17 is the source value; bit 18 is the load value; and bit 19 is parity. The source value in the first network connection file entry is changed to the value saved in the internal flip-flop (described above) and the source code is examined to see whether there is a single source a wired AND or wired OR function being simulated, or a bidirectional node is encountered. Depending on the source code, a new resultant source is determined at this point or else linking is continued into the network connection file 50. When the resultant source is found, and if a change is detected, the start address register 51e is used to modify the loads.

The network simulation processor of FIG. 4 can handle only one change at a time. While it is handling a change, or has an outstanding request to accept one, it sets an NSP busy flip-flop in local source control unit 53 which signals the simulation controller that it cannot accept a message at that time. The output from this flip-flop is used by simulation controller 12 of FIG. 1 and is one of the terms in the equation to determine when the current simulation has stabilized. Other terms in this equation include logic simulation processor busy signal, logic simulation processor requires swap, as well as a local error signal from fail register 54c.

When a swap has been requested, simulation controller 12 of FIG. 1 transmits a swap signal which is received by global control unit 55 and can also stop simulation by sending a stop signal which, when received by the affected logic simulation processors, stops the simulation when that processor comes to an end-of-loop instruction (ENDL) in its instruction table.

If the processor of FIG. 4 receives a change notice with the flag set, denoting a message, from a device which it is controlling, it appends the identification of the device from which it was received by word 0 register 51b and forwards it to its global controller without attempting to interpret its content. If it receives such a notice from its global controller, it simply forwards it to the addressed device. Such notices may not be addressed to the network simulation processor of FIG. 4 itself. They are only meant for logic simulation processors 10 and simulation controller 12 of FIG. 1.

The bus control module interface to the global side of a network simulation processor maintains an on-line/off-line indicator for that processor. If an on-line processor detects an internal error, it sends an indication to that bus control module. The bus control module records the error in a register and takes the network simulation processor off-line and forwards the error indication on to the simulation controller as does a corresponding bus control module for a logic simulation processor.

If a message is sent to an off-line network simulation processor, that processor will receive the message. It will, however, be unable to transmit globally or locally for the bus control module will block any out-going signals from that processor and the bus control module will report an error flag.

Figure 5:
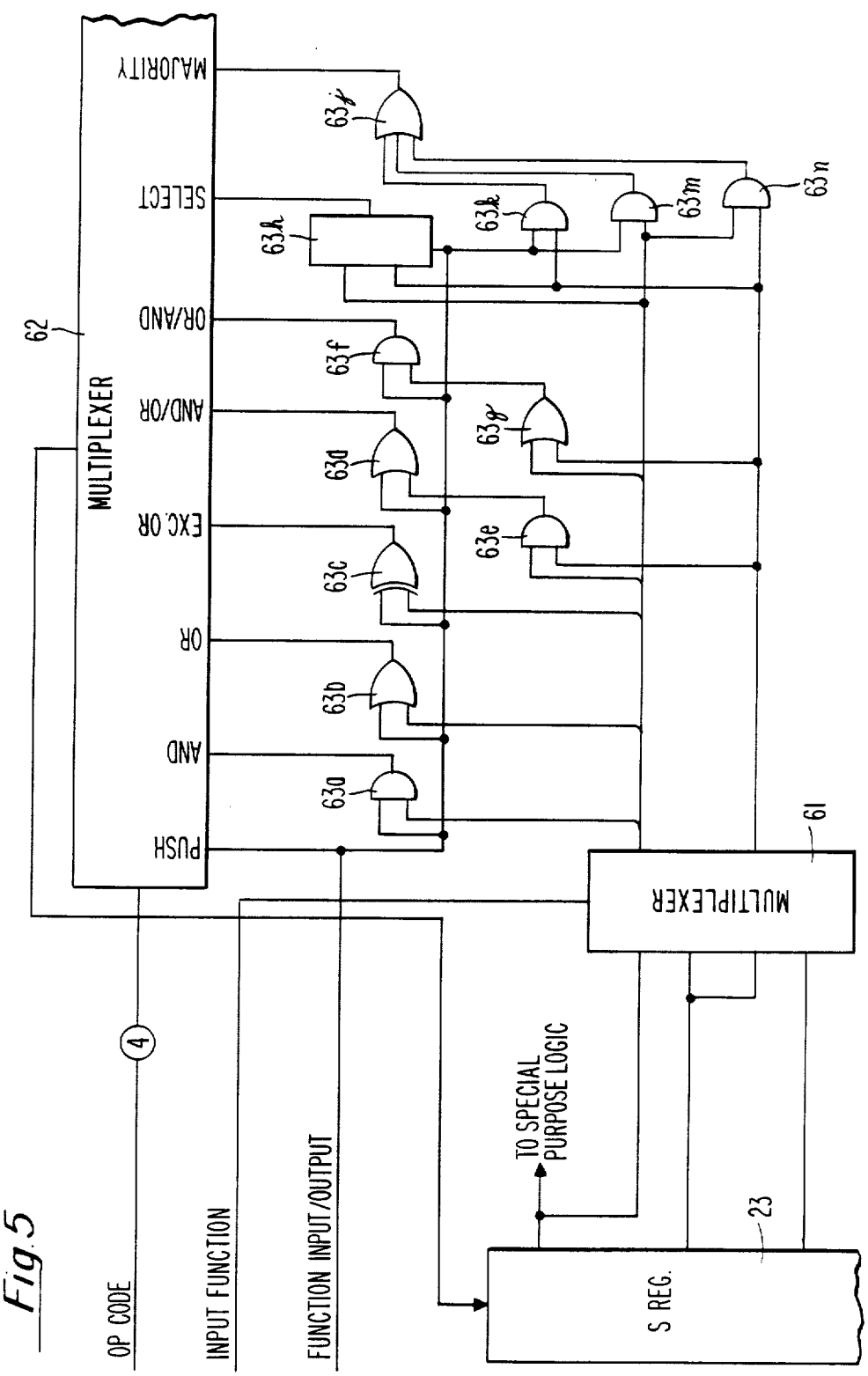
FIG. 5 is a schematic diagram of the logic circuitry of the data function unit.

A portion of the actual logic circuitry of data function unit 20 of FIG. 2 is illustrated in FIG. 5. The op-code portion of an instruction is received by multiplexer 62 to select the output of logic circuits for the first eight instructions that were described above. An input function which may just be a value from value table 21 of FIG. 2 is supplied to all the logic gates 63a, ... d, 63f, select function 63h, which in essence performs a multiplexing simulation and gates 63j, ... m. The output of multiplexer 62 goes to S register 23 which is the top register in a pushdown or first in-last out stack as was described in relation to FIG. 2. Special purpose logic for other functions has not been shown in FIG. 5.

The other inputs to the logic gates are bits 0, 1 or 2, of S register 23 and are selected by multiplexer 61 according to the input function code supplied thereto.

EPILOGUE

An array of various types of processors, as well as the actual processors, has been described above for the purpose of simulating computer functions for large computer systems. These functions may vary from simple AND, OR and other functions to large arithmetic logic units and even random access memories. The simulation array is a tree-type of array where the leaves of the tree are the actual logic simulation processors with the other processors serving as nodes which route change of value notices among the various logic simulation processors. Each of the logic simulation processors is separately programmable under hierarchical control by a simulation control processor at the root of the tree which monitors various simulations and also provides an external interface to a host system that may be a general purpose computer.

While but one embodiment of the present invention has been disclosed, it will be apparent to those skilled in the art that variations and modifications may be made therein without departing from the spirit and the scope of the invention as claimed.

What is claimed is:

1. An array of logic simulation processors for simulating complex logic functions formed of primitive logic functions, said array comprising:
   a plurality of logic simulation processors; and
   node processing means coupled to each of said logic simulation processors for transmitting value change notices therebetween;
   each of said logic simulation processors including a function unit including circuit means having different logic gates for execution of different ones of said primitive logic functions;
   each of said logic processors further including value table means for storing present value signals, said value table means being coupled to said function unit to supply individual ones of said present value signals to said function unit;

each of said logic simulation processors further including instruction table means for storing a sequence of instructions each of which specifies a particular primitive function to be executed and an address to said value table means to fetch a given one of said present value signals, said instruction table means being coupled to said value table means and said function unit to control the execution of a specified primitive function upon a given present value signal received from said value table means in response to the address contained in a given instruction.

2. An array according to claim 1 wherein each of said logic simulation processors includes:
sequencing means coupled to its corresponding instruction table means to control a sequence of primitive function executions by said corresponding function unit upon present value signals addressed by each of said instructions in said sequence of instructions.

3. An array according to claim 2 further including:
a plurality of registers arranged as a push-down stack having a top register, the top register of such stack being coupled to said function unit to receive the result signal of a primitive function execution and to transmit the result signal to said function unit as a second input signal to the execution of a second primitive function.

4. An array according to claim 3 wherein each of said logic simulation processors includes:
an internal change flip-flop circuit;
said circuit means in said function unit including comparison means to compare a present value signal received from said value table means with a value signal received from said push-down stack, said comparison means being coupled to said internal change flip-flop circuit to set said flip-flop circuit if the two value signals do not compare and to replace said present value signal in said value table means with said value signal received from said push-down stack.

5. An array according to claim 4 wherein each sequence of instructions includes an end of sequence instruction, each of said logic simulation processors further including:
means coupled to said instruction table means to repeat said sequence of instructions when said end of sequence instruction is encountered and said internal change flip-flop has been set.

6. An array according to claim 5 wherein each of said logic simulation processors further includes:
an external change flip-flop circuit;
said circuit means including means to set said external change flip-flop circuit and reset said internal change flip-flop circuit when said sequence of instructions is completed.

7. An array of logic simulation processors for simulating complex logic functions formed of primitive logic functions, said array comprising:
a plurality of logic simulation processors; and
a plurality of node processing means coupled to each other and neighboring logic simulation processors to form a tree array with one node processing means serving as the root of said tree array and said logic simulation processors serving as the leaves of said tree array;
each of said simulation processors including a function unit including circuit means having different logic gates for executing different ones of said primitive logic functions;
each of said logic processors further including value table means for storing present value signals, said value table means being coupled to said function unit to supply individual ones of said present value signals to said corresponding function unit;
each of said logic simulation processors further including instruction table means for storing a sequence of instructions each of which specifies a particular primitive function for execution and an address to said value table means to fetch a given one of said present value signals, said instruction table means being coupled to said value table means and said function unit to control the execution of a specified primitive function upon a given present value signal received from said value table means in response to the address contained in a given instruction.

8. An array according to claim 7 further including:
a plurality of registers arranged as a push-down stack having a top register, the top register of such stack being coupled to said function unit to receive the result signal of a primitive function execution and to transmit the result signal to said function unit as a second input signal to the execution of a second primitive function.

9. An array according to claim 8 wherein each of said logic simulation processors includes:
an internal change flip-flop circuit;
said circuit means in said function unit including comparison means to compare a present value signal received from said value table means with a value signal received from said push-down stack, said comparison means being coupled to said internal change flip-flop circuit to set said flip-flop circuit if the two value signals do not compare and to replace said present value signal in said value table means with said value signal received from said push-down stack.

10. An array according to claim 9 wherein each sequence of instructions includes an end of sequence instruction, each of said logic simulation processors further including:
means coupled to said instruction table means to repeat said sequence of instructions when said end of sequence instruction is encountered and said internal change flip-flop has been set.

11. An array according to claim 10 wherein each of said logic simulation processors further includes:
an external change flip-flop circuit;
said circuit means including means to set said external change flip-flop circuit and reset said internal change flip-flop circuit when said sequence of instructions is completed.

* * * * *